(12) United States Patent
Sankman et al.

(10) Patent No.: US 9,941,054 B2
(45) Date of Patent: Apr. 10, 2018

(54) INTEGRATION OF EMBEDDED THIN FILM CAPACITORS IN PACKAGE SUBSTRATES

(71) Applicant: Intel Corporation, Santa Clara, CA (US)

(72) Inventors: Robert L. Sankman, Phoenix, AZ (US); Daniel N. Sobieski, Phoenix, AZ (US); Sri Ranga Sai Boyapati, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/214,390

(22) Filed: Jul. 19, 2016

(65) Prior Publication Data

US 2016/0329153 A1    Nov. 10, 2016

Related U.S. Application Data (63) Continuation of application No. 14/490,615, filed on Sep. 18, 2014, now Pat. No. 9,420,693.

(51) Int. Cl.
*H05K 1/09* (2006.01)
*H01G 4/33* (2006.01)
(Continued)

(52) U.S. Cl.
CPC ........... *H01G 4/33* (2013.01); *H01L 21/4857* (2013.01); *H01L 23/49822* (2013.01);
(Continued)

(58) Field of Classification Search
USPC .................................................. 174/251, 250
See application file for complete search history.

(56) References Cited

U.S. PATENT DOCUMENTS 7,785,980 B2  8/2010  Suzuki
2005/0285170 A1* 12/2005  Mikawa ............ H01L 27/11507
                                                                    257/295
(Continued)

FOREIGN PATENT DOCUMENTS

JP        1991-203261         9/1991

OTHER PUBLICATIONS

Official Letter along with Search Report from the IP Office for Taiwan Patent Application No. 104118154 dated Jun. 4, 2016.
(Continued)

*Primary Examiner* — Andargie M Aychillhum
(74) *Attorney, Agent, or Firm* — Schwabe, Williamson & Wyatt, P.C.

(57) ABSTRACT

An embedded thin film capacitor and methods of its fabrication are disclosed. The embedded thin film capacitor includes two conductive plates separated by a dielectric layer. In embodiments, the capacitor is enclosed within a package substrate. A method of forming the embedded thin film capacitor includes forming a first insulating layer on a bottom plate and a first trace. A first opening is then formed in a first insulating layer to expose a first region of a bottom plate. An adhesive layer is then formed on the first insulating layer and on top of the exposed first region of the bottom plate. A second opening is formed through the insulating layer and the first insulating layer to expose a second region of the bottom plate. A top plate is formed within the first opening and a via is formed within the second opening.

15 Claims, 9 Drawing Sheets

(51) Int. Cl.
*H01L 21/48* (2006.01)
*H01L 23/498* (2006.01)
*H05K 1/11* (2006.01)
*H05K 1/18* (2006.01)
*H05K 3/00* (2006.01)
*H05K 3/18* (2006.01)
*H05K 3/46* (2006.01)
*H05K 1/16* (2006.01)

(52) U.S. Cl.
CPC ......... *H01L 23/49827* (2013.01); *H05K 1/09* (2013.01); *H05K 1/115* (2013.01); *H05K 1/162* (2013.01); *H05K 1/185* (2013.01); *H05K 3/0017* (2013.01); *H05K 3/188* (2013.01); *H05K 3/467* (2013.01); *H01L 2224/16225* (2013.01); *H01L 2924/15311* (2013.01); *H05K 3/4644* (2013.01); *H05K 2201/10015* (2013.01)

(56) References Cited

U.S. PATENT DOCUMENTS

| | | | | |
|---|---|---|---|---|
| 2008/0315762 | A1* | 12/2008 | Hamada | C09K 11/7734 313/509 |
| 2011/0019335 | A1* | 1/2011 | Wu | H01G 4/005 361/303 |
| 2011/0284269 | A1* | 11/2011 | Maeda | H05K 1/113 174/251 |
| 2013/0010432 | A1 | 1/2013 | Sundstrom et al. | |
| 2013/0319740 | A1* | 12/2013 | Sato | H05K 1/185 174/258 |

OTHER PUBLICATIONS

Huemoeller, Ron et al., "Unveiling the Next Generation in Substrate Technology", 2006 Pacific Microelectronics Symposium, Jan. 2007, Amkor Technology, Inc. (10 pgs).

Notice of Allowance (2 pages) from the Taiwan Intellectual Property Office for Taiwan Patent Application No. 104125649 dated Nov. 16, 2016 and English Translation thereof (1 page).

Notice of Preliminary Rejection (3 pages) from the Korean Intellectual Property Office (KIPO) for Korean Patent Application No. 2015-0115269S dated Sep. 19, 2016 and English Translation thereof (1 page).

Official Action from the Japanese Patent Office for Japanese Patent Application No. 2015-160883 dated Jul. 5, 2016 and English Translation thereof.

Office Action from Japanese Patent App. No. 2017-000454, dated Dec. 21, 2017, 7 pages.

* cited by examiner

INTEGRATION OF EMBEDDED THIN FILM CAPACITORS IN PACKAGE SUBSTRATES

This is a Continuation of application Ser. No. 14/490,615 filed Sep. 18, 2014, which is hereby incorporated by reference.

TECHNICAL FIELD

Embodiments of the present invention relate generally to embedded devices. More particularly, embodiments of the present invention relate to embedded thin film capacitors and methods of their fabrication.

BACKGROUND

Capacitors are an integral part of modern electronic systems such as wireless radio frequency systems and computer systems. They are used for many purposes, such as energy storage, signal coupling/decoupling, and electronic filtering. Typically, capacitors are formed of two conductive plates separated by a thin dielectric layer. The dielectric layer electrically insulates the plates from one another so that current cannot flow across them. When a voltage is applied, charge builds up on the plates and creates an electric field. The electric field prevents the charge from dissipating, which causes the charge to store in the capacitor. Although their design is simple, their integration into electronic systems proves challenging. Capacitors are bulky and occupy valuable package real estate. Furthermore, their close proximity to an integrated circuit is critical to meeting the desired system performance.

Current methods addressing these challenges have significant shortcomings. For instance, current methods mount capacitors on the top and/or bottom of a package substrate proximal to the integrated circuit. Mounting capacitors external to the package substrate substantially increases the package assembly size, which severely limits available real estate in compact electronic devices. Current methods also embed capacitors within a package substrate. Embedding the capacitors requires performance of several additional steps. For instance, an additional surface roughening step and an additional lamination step are typically required. Adding the steps reduces throughput and increases cost. Embedding the capacitors also requires purchase of a proprietary dielectric layer (e.g., 3M™ Embedded Capacitance Material (ECM)), which further increases cost. Additionally, the thickness of the proprietary dielectric layer increases the size of the embedded capacitor. Increasing the capacitor's size decreases the maximum obtainable capacitance density.

DETAILED DESCRIPTION

Embodiments of the invention are directed to embedded thin film capacitors and methods of their fabrication. In one embodiment of the invention, an embedded thin film capacitor is formed of two conductive plates separated by a thin layer of insulating material. For example, the embedded thin film capacitor may be formed of two copper plates separated by a thin layer of silicon nitride. In an embodiment, the embedded thin film capacitor is integrated into a package substrate so that the capacitor is completely enclosed within the package substrate. Accordingly, various conductive traces and vias within the package substrate may be disposed around the embedded thin film capacitor. In an embodiment, the embedded thin film capacitor is formed of the same materials as the conductive traces and vias of the package substrate.

According to an embodiment of the invention, a method for fabricating the embedded capacitor includes forming an insulating layer on a bottom plate. For example, the insulating layer may be laminated on the bottom plate by vacuum lamination. The method may further include forming a first opening in the insulating layer to expose a first portion of the bottom plate. In embodiments, the first opening is formed by laser ablation followed by a desmearing process to remove any remaining organic residue. A thin layer of dielectric material may then be deposited. For instance, the thin layer of dielectric material may be conformally deposited by plasma enhanced chemical vapor deposition (PECVD). Once the dielectric material has been deposited, a second opening may then be formed to expose a second portion of the bottom plate. In an embodiment, the second opening is formed through the dielectric layer and the insulating layer to expose a different portion of the bottom plate than the first opening. Thereafter, a top plate and a via may be formed within the first and second openings, respectively. For example, the top plate and via may be simultaneously deposited by a single electrolytic plating process.

Embodiments of the invention disclosed herein provide a method that does not require additional surface roughening or lamination steps. A surface roughening step promotes bonding of two structures by increasing the surface area of the bonding surfaces. In embodiments, instead of performing a surface roughening step, an adhesion layer is used to promote bonding between two structures. As a result, the surface roughening step is not required. According to an embodiment of the invention, the adhesion layer may be used to realize other benefits. For instance, the adhesion layer can also be used as a dielectric layer for an embedded capacitor. Thus, a proprietary dielectric layer is not required to fabricate the embedded capacitors according to embodiments of the invention. In an embodiment, the process of fabricating the embedded capacitor seamlessly integrates with the process of forming a package substrate. For example, the embedded capacitor, vias, and traces of a package substrate can be simultaneously formed by the same process steps. Thus, embodiments of the invention have increased throughput, higher capacitance density, and are less costly than conventional methods.

Figure 1A:
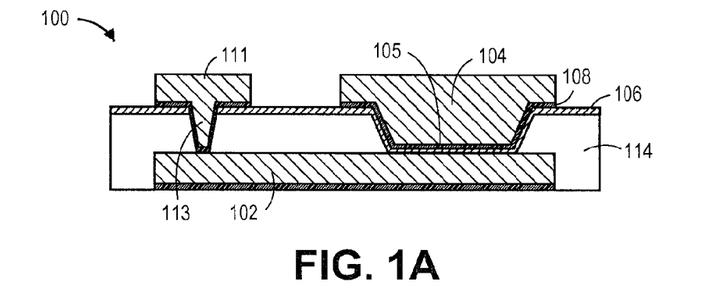
FIGS. 1A-1B illustrate a cross-sectional and top-down view of an embedded thin film capacitor, in accordance with an embodiment of the invention.
Figure 1B:
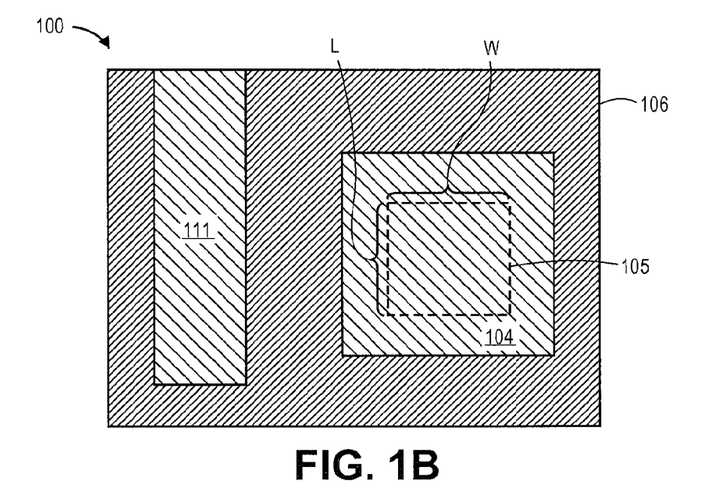
Figure 1C:
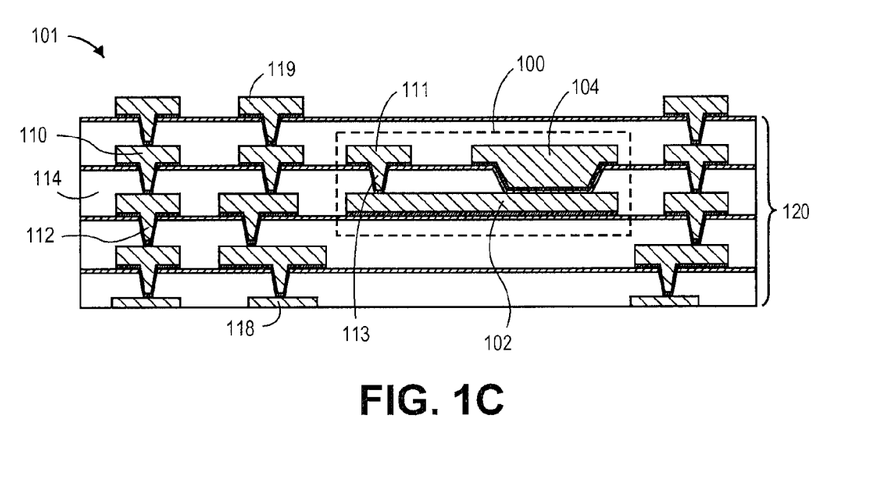
FIG. 1C illustrates a cross-sectional view of an embedded thin film capacitor in a package substrate, in accordance with an embodiment of the invention.

With reference now to FIGS. 1A-1C, an embedded thin film capacitor and a package substrate having an embedded thin film capacitor therein are illustrated according to embodiments of the invention. FIG. 1A illustrates a cross-sectional view of an embedded thin film capacitor 100. In embodiments, the embedded thin film capacitor 100 is a parallel plate capacitor that includes a top plate 104 and a bottom plate 102 separated by a portion of an adhesion layer 106. Embedded thin film capacitor 100 also includes a capacitor trace 111 coupled to the bottom plate 102 by a capacitor via 113 so that a voltage may be applied to the bottom plate 102. In an embodiment, the plates 104 and 102, capacitor traces 111, and capacitor vias 113 are formed of any suitable conductive material, such as a metal. In a particular embodiment, the plates 104 and 102, capacitor traces 111, and capacitor vias 113 are formed of copper.

Adhesion layer 106 is disposed on top of the insulating layer 114 and in between the plates 104 and 102. Adhesion layer 106 attaches both the capacitor trace 111 and top plate 104 to the insulating layer 114. According to embodiments, adhesion layer 106 also performs as a dielectric layer for the embedded thin film capacitor 100. Specifically, the portion of the adhesion layer 106 disposed directly between the top and bottom plates 104 and 102 performs as a dielectric layer for the embedded thin film capacitor 100. The adhesion layer 106 electrically insulates the top plate 104 from the bottom plate 102. Such electrical insulation allows charge to accumulate in the top and bottom plates 104 and 102 when a voltage is applied. Accordingly, the adhesion layer may have a dielectric constant sufficient to electrically insulate the top plate 104 from the bottom plate 102. In an embodiment, the dielectric constant of the adhesion layer 106 is between 4 and 9. Adhesion layer 106 may also be thick enough to form a strong bond between the insulating layer 114 and both the capacitor trace 111 and the top plate 104 that withstands subsequent processing conditions. For example, the adhesion layer 106 may have a thickness between 30 to 200 nm or, more specifically, 40-100 nm. In a particular embodiment, the thickness is around 50 nm. The adhesion layer 106 may be formed of any suitable insulating and adhesive material such as, but not limited to, silicon dioxide, silicon nitride, and silicon oxynitride.

As one skilled in the art would readily appreciate, the capacitance per unit area of a general parallel plate capacitor is calculated by the dielectric constant multiplied by the permittivity of free space divided by the dielectric thickness. Capacitance is therefore determined by multiplying the capacitance per unit area by a surface area of the capacitor. The surface area of a capacitor is determined by the amount of overlapping area between regions of the two plates directly adjacent to the dielectric layer. Thus, capacitance can be modulated by either changing the surface area of the capacitor and/or changing the dielectric thickness. According to an embodiment of the present invention, the surface area of the embedded thin film capacitor 100 is determined by the surface area of the bottom surface 105 of the top plate 104. The bottom surface 105 can have a width W and a length L as shown in FIG. 1B, which illustrates a top-down perspective of the embedded thin film capacitor 100 depicted in FIG. 1A.

Dimensions of the capacitor 100 may be modulated to achieve a target capacitance and/or spatial constraints. For instance, the capacitor 100 may be a square with equal widths W and lengths L, a rectangle with different widths W and lengths L, an L-shaped structure, or any other suitable shape or form necessary to fit within structural design limitations while achieving the target capacitance. In an embodiment, bottom surface 105 has a surface area of less than 10 mm$^2$. In addition to modulating the dimensions of the capacitor 100, the dielectric thickness may be modulated as well. Capacitance is inversely proportional to the dielectric thickness. Thus, capacitance decreases as the dielectric thickness increases, and the capacitance increases as the dielectric thickness decreases. Modulating the dielectric thickness may affect the bonding strength of the adhesive layer 106. Accordingly, the dielectric thickness may be modified within the acceptable thicknesses of the adhesive layer 106. In an embodiment, the dielectric thickness ranges from 30 to 200 nm or, more specifically 40 to 100 nm. In a particular embodiment, the thickness is around 50 nm.

Due to the particularly small size of the embedded thin film capacitor 100, its utility may be limited to certain low-capacitance applications. For instance, embedded thin film capacitor 100 may be particularly useful as part of a radio frequency (RF) tuning circuit or as part of a BALUN between an RF amplifier and an antennae. The BALUN, such as an L-C (inductor-capacitor) lumped BALUN consisting of two capacitors and two inductors, helps convert between a balanced signal and an unbalanced signal in RF devices.

Insulating layer 114 may be part of a build-up structure 120 for a package substrate, such as a coreless package substrate 101 illustrated in FIG. 1C. The insulating layer 114 may have a thickness sufficient to substantially prevent electrical interference between structures above and below the insulating layer 114. For instance, insulating layer 114 may have a thickness ranging from 35 to 55 μm. In an embodiment, insulating layer 114 is formed of any suitable insulating material. For example, insulating layer 114 may be formed of an organic build-up film containing carbon, hydrogen, and/or oxygen. In an embodiment, the insulating layer 114 is formed of an epoxy-based resin. The organic build-up film may be impregnated with an inorganic filler, such as a silica filler, to provide suitable mechanical properties that meet reliability requirements of the package substrate or system board. Accordingly, the insulating layer 114 may be formed of an epoxy-based resin with a silica filler. Insulating layer 114 may also be formed of a photosensitive insulating layer such that the insulating layer 114 may be patterned by optical exposure. In such instances, the insulating layer 114 includes a photopack additive. In a particular embodiment, the insulating layer 114 is formed of Ajinomoto Build-up Film (ABF).

In addition to the insulating layers 114 illustrated in FIG. 1C, the package substrate 101 may also include other structures along with the embedded capacitor 100 such as build-up traces 110 and build-up vias 112 within the build-up structure 120, as well as top pads 119 and bottom pads 118. The build-up traces 110 and build-up vias 112, in conjunction, form various electrical pathways through the build-up structure 120 to interconnect the pads 118 and 119 to each other, and to electrical devices (e.g., embedded interconnect bridges) within the package substrate 101 if present. In embodiments, the capacitor trace 111 and the build-up traces 110 have the same structure and are formed of the same materials. In embodiments, the top surface of the top plate 104 is substantially coplanar with the top surface of the build-up traces 110 directly lateral to the top plate 104. Additionally, in embodiments, the top surface of the bottom plate 102 is substantially coplanar with the top surface of the build-up traces 110 directly lateral to the bottom plate 102.

Although the package substrate 101 in FIG. 1C is illustrated as a coreless package substrate, embodiments are not so limited. For instance, embodiments of the invention include, but are not limited to, cored package substrates, system boards (e.g., motherboards), and substrates containing an embedded device, such as an embedded interconnect bridge for high bandwidth applications.

Figure 2A:
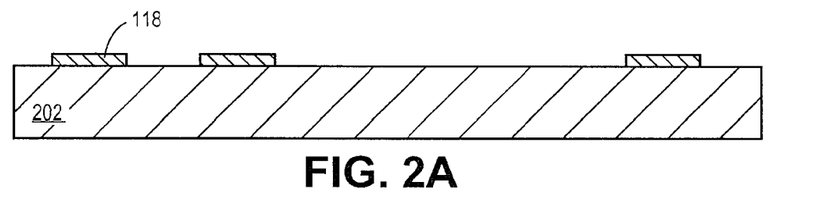
FIGS. 2A-2S illustrate cross-sectional views of a method of forming an embedded thin film capacitor within a package substrate, in accordance with an embodiment of the invention.
Figure 2B:
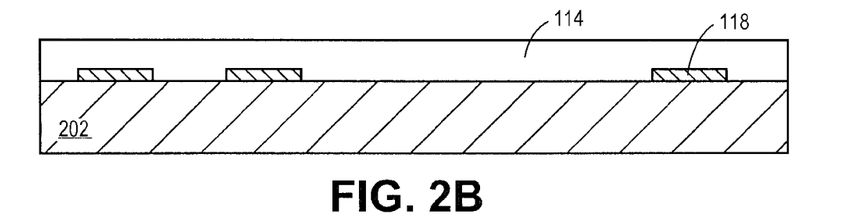
Figure 2C:
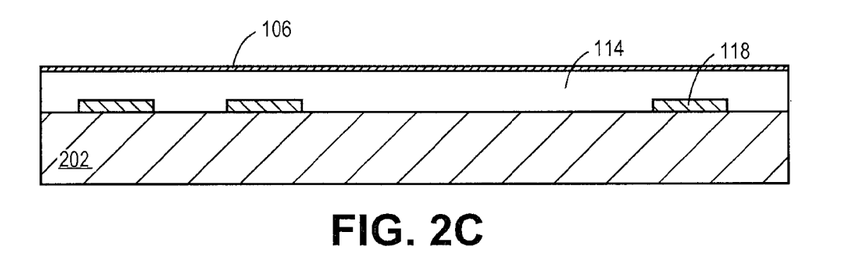
Figure 2D:
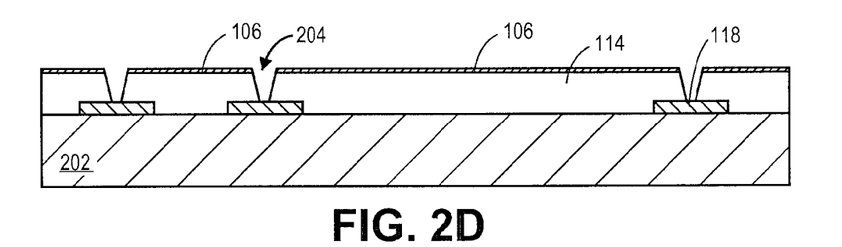
Figure 2E:
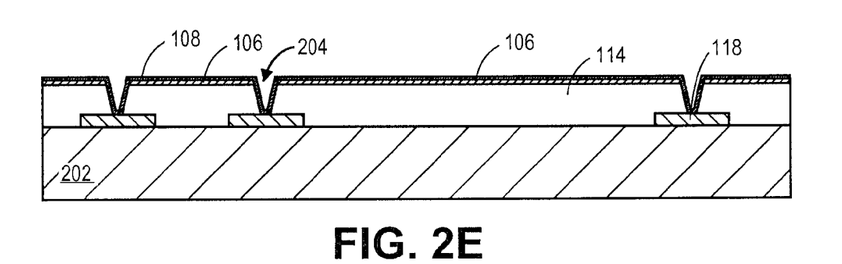
Figure 2F:
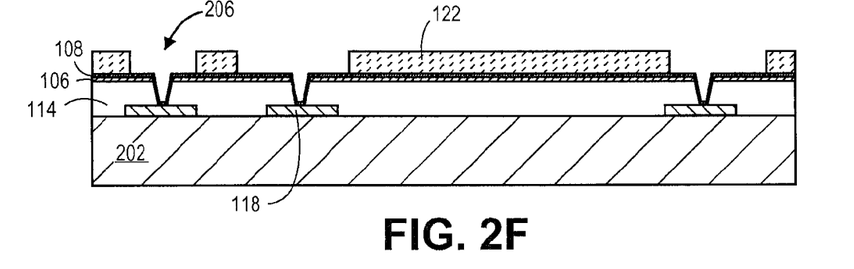
Figure 2G:
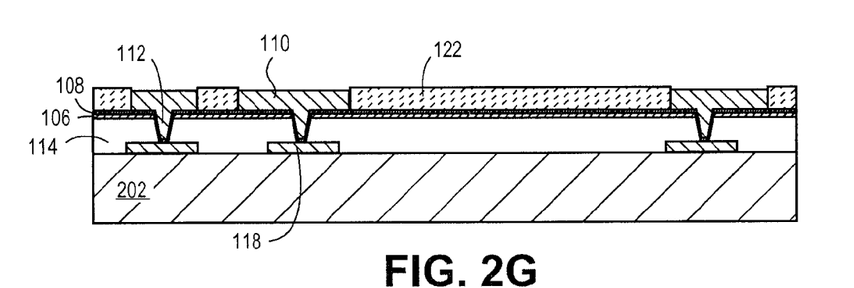
Figure 2H:
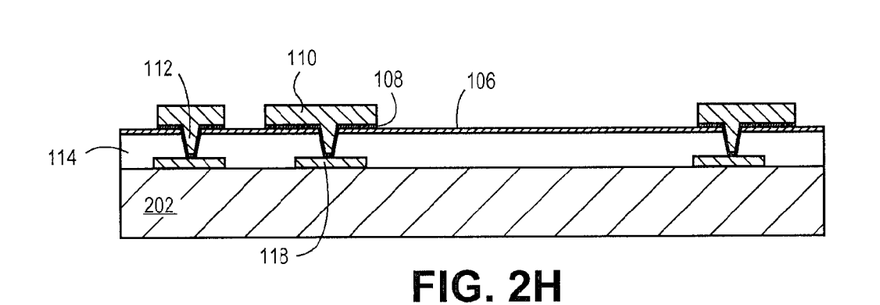
Figure 2I:
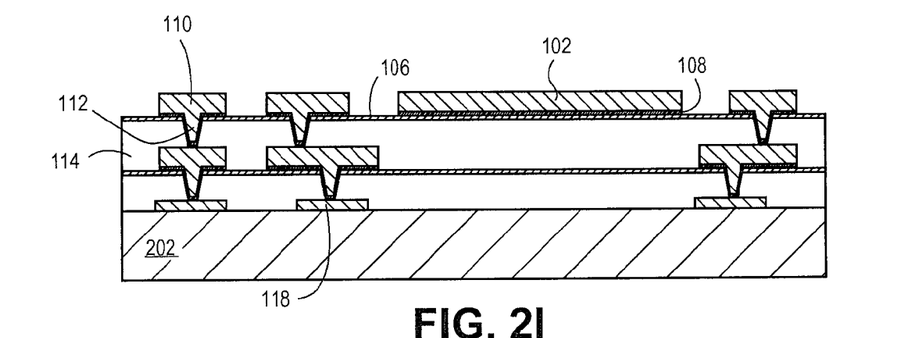
Figure 2J:
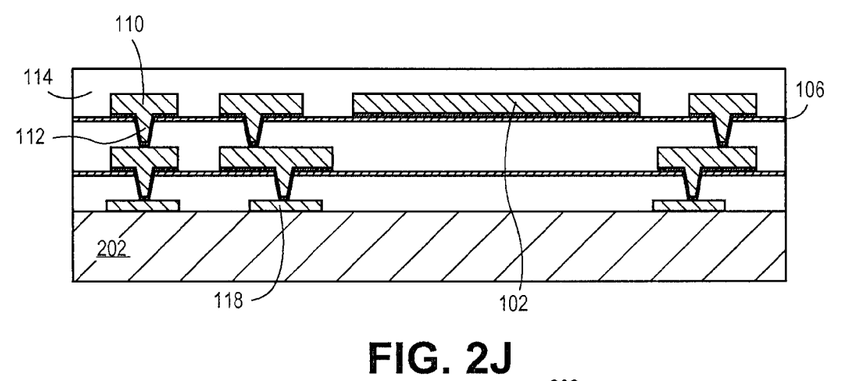
Figure 2K:
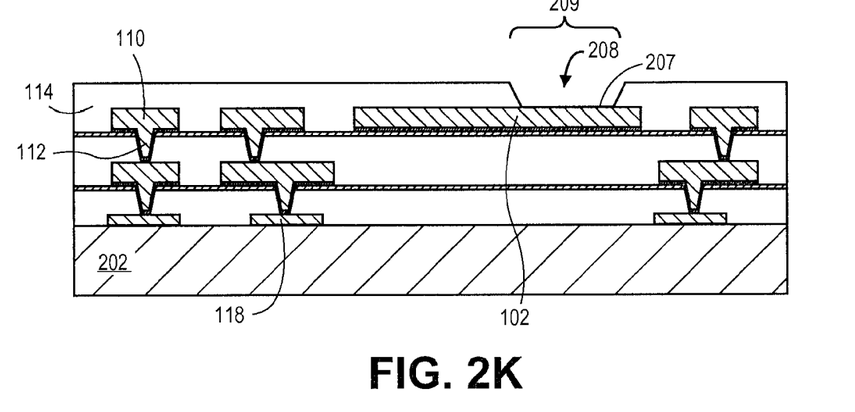
Figure 2L:
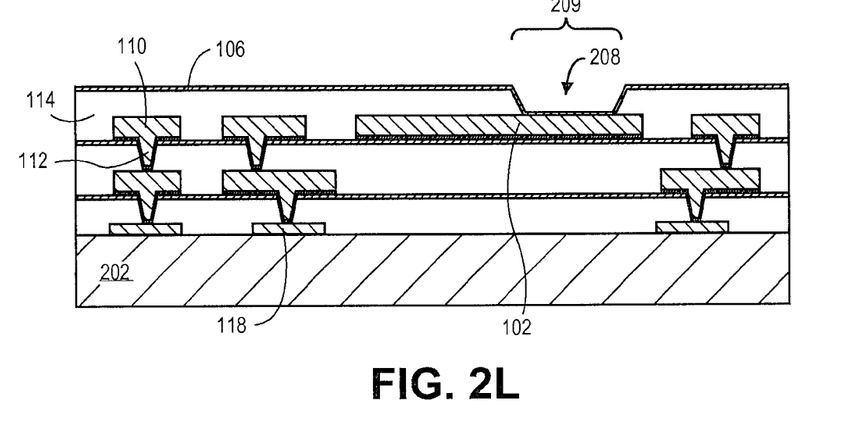
Figure 2M:
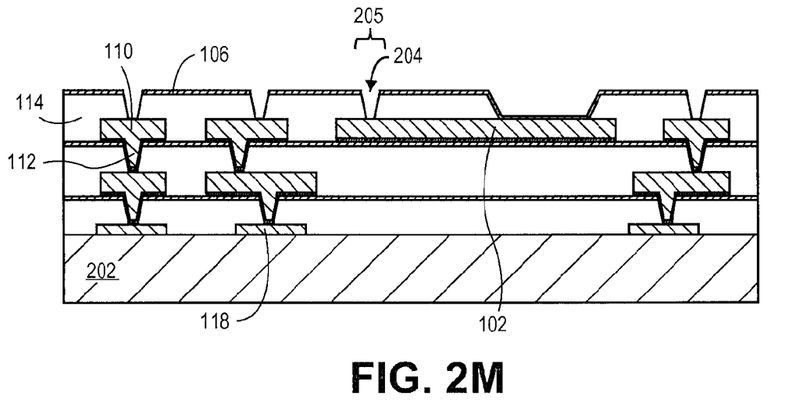
Figure 2N:
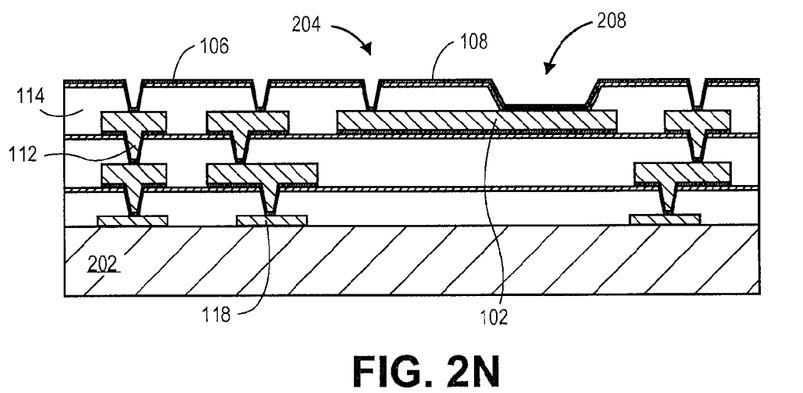
Figure 2O:
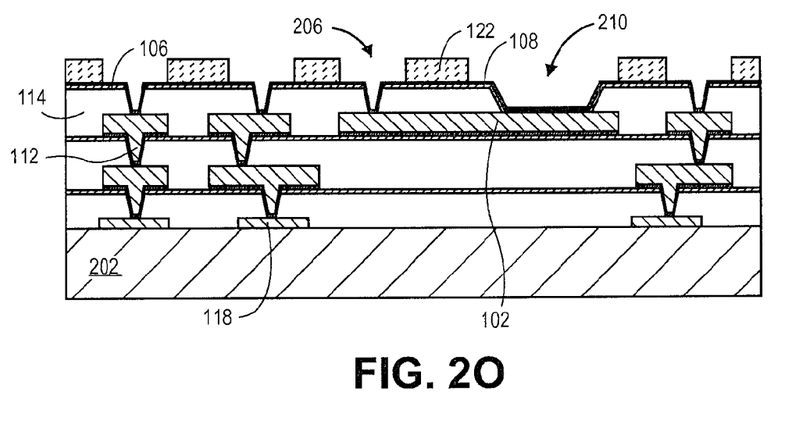
Figure 2P:
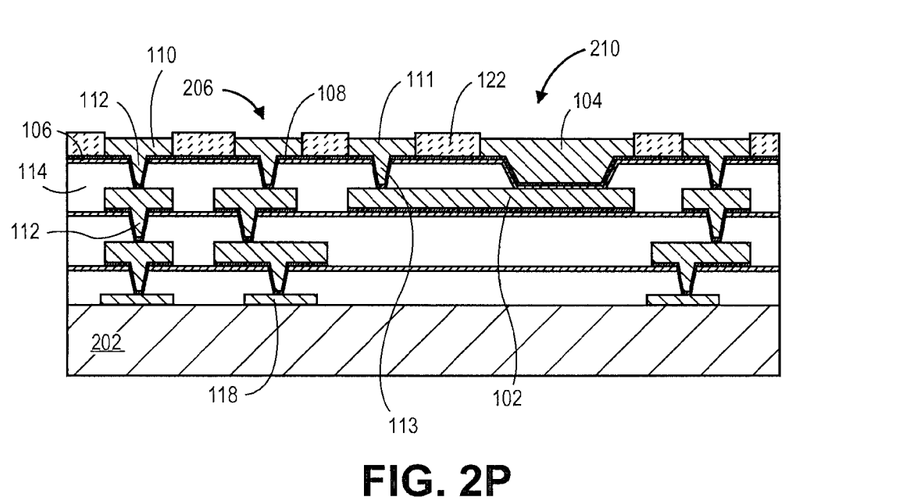
Figure 2Q:
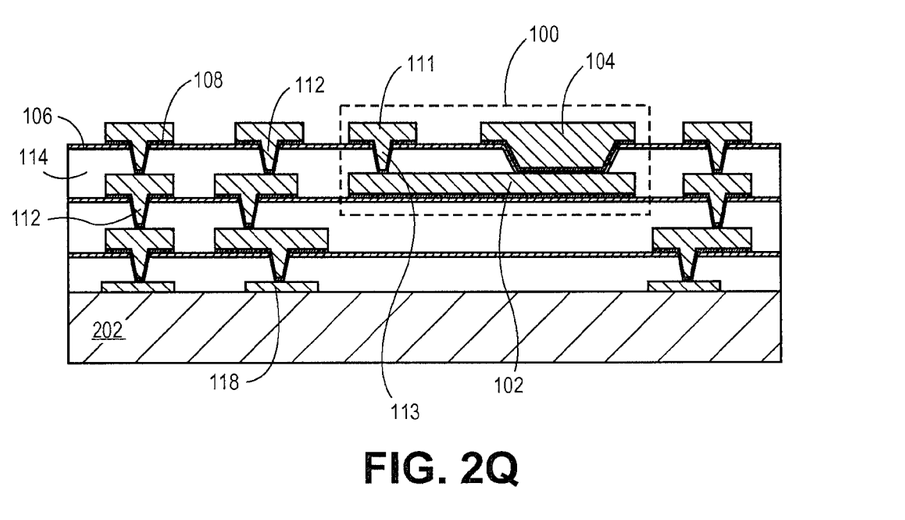
Figure 2R:
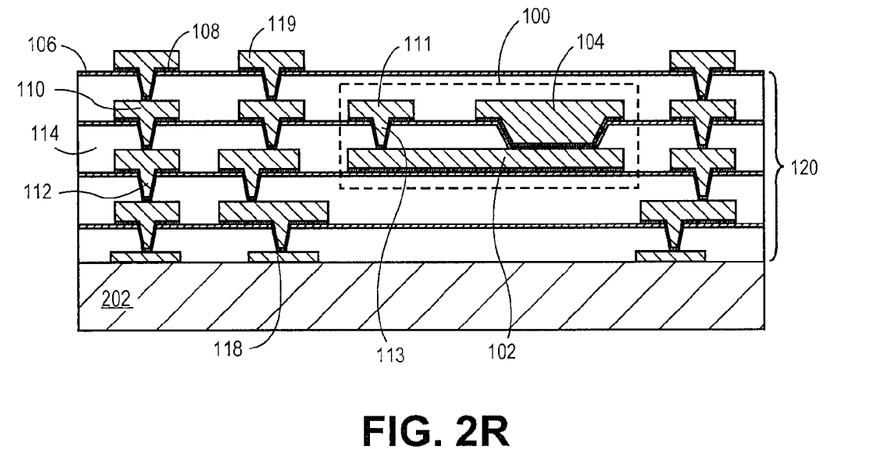
Figure 2S:
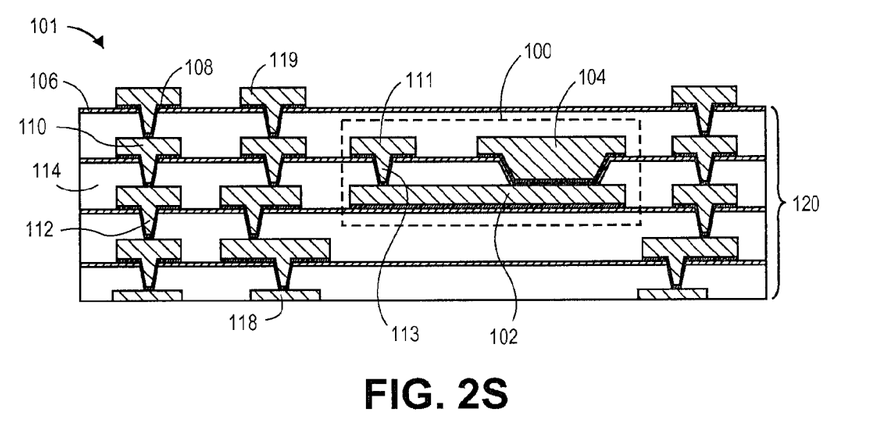

The following description herein made with respect to FIGS. 2A-2S discloses a method of forming a coreless package substrate with an embedded thin film capacitor according to an embodiment of the invention. Notably, FIGS. 2B-2H illustrate a method of performing a semi-additive process (SAP) used to form one layer of the build-up structure, and FIGS. 2J-2Q illustrate a method of fabricating an embedded thin film capacitor within the coreless package substrate according to an embodiment of the invention. While FIGS. 2A-2S illustrate the method of forming a coreless package substrate, one skilled in the art would appreciate that the method may be implemented for any laminate package substrate, such as cored package substrates, package substrates containing embedded interconnect bridges, and system boards.

As shown in FIG. 2A, a series of bottom pads 118 are patterned on a substrate 202. The substrate 202 may be any suitable rigid substrate that provides a rigid base upon which structures may form. In an embodiment, the substrate 202 is a temporary substrate formed of a stiffening core that is removed after fabrication of the coreless package substrate. Alternatively, the substrate 202 is a stiffening core that remains as part of a cored package substrate. The substrate 202 may be any well-known stiffening core that is formed of materials different from the build-up structure 120. In an embodiment, the substrate 202 is a panel containing multiple package substrates. For example, the substrate 202 may be a panel containing an N×N array of package substrates.

The bottom pads 118 may be patterned on the substrate 202 by initially forming a patterned dry film resist (DFR) layer on top of the substrate 202 in areas where the bottom pads 118 are not intended to be formed. Afterwards, a conductive material may be blanket deposited and the DFR layer may be subsequently removed along with portions of the conductive material disposed on top of the patterned DFR layer. In embodiments, the remaining conductive material on top of the substrate 202 form the bottom pads 118. The bottom pads 118 may be formed of any suitable conductive material. For example, the bottom pads 118 may be formed of a metal, such as tungsten, aluminum, and copper. In a particular embodiment, the bottom pads 118 are formed of copper.

Next, in FIG. 2B, an insulating layer 114 is formed on top of the substrate 202 and the bottom pads 118, thereby beginning an SAP for formation of the build-up structure 120 shown in FIG. 1C. The insulating layer 114 may be formed by any suitable lamination technique, such as vacuum lamination. In an embodiment, the insulating layer 114 is formed to have a thickness sufficient to prevent electrical interference between structures above and below the insulating layer 114. For instance, the insulating layer 114 may have a thickness between 15 to 55 μm. In embodiments, the insulating layer 114 is formed of any suitable insulating material, such as an epoxy-based resin with a silica filler, that provides suitable mechanical properties to meet reliability requirements of the package substrate or system board. In a particular embodiment, the insulating layer 114 is formed of ABF.

Thereafter, in FIG. 2C, an adhesion layer 106 is formed on top of the insulating layer 114. Any suitable highly conforming deposition process may be utilized to form the adhesion layer 106. For instance, processes such as, but not limited to, chemical vapor deposition (CVD), plasma enhanced chemical vapor deposition (PECVD), molecular beam epitaxy (MBE), and atomic layer deposition (ALD) may be used to form the adhesion layer 106. In a particular embodiment, the adhesion layer 106 is formed by PECVD. For the SAP, adhesion layer 106 is formed immediately after laminating the insulating layer 114. In an embodiment, no intervening step is performed between laminating the insulating layer 114 and forming the adhesion layer 106. This is not the case, however, for the method of forming the embedded capacitor 100 as discussed herein with respect to FIGS. 2J-2Q.

The adhesion layer 106 performs as an adhesive that attaches structures to the insulating layer 114 by a chemical bond. In an embodiment, the adhesion layer 106 has a thickness sufficient to bond structures onto the insulating layer 114 with a bonding strength strong enough to withstand subsequent processing conditions. In embodiments, the thickness of the adhesion layer 106 is between 30 to 200 nm or, more specifically, 40 to 100 nm. In a particular embodiment, the thickness is around 50 nm. Any suitable adhesive and insulating material may be used to form the adhesion layer 106. For instance, the adhesion layer 106 may be formed of silicon oxide, silicon nitride, or silicon oxynitride.

Next, via openings 204 are formed to expose portions of the bottom pads 118. In an embodiment, via openings 204 are formed through the adhesion layer 106 and the insulating layer 114. The via openings 204 may be formed by any suitable etching technique, such as laser ablation. Following laser ablation, organic residue created by high temperatures generated during laser ablation may be left behind within the via openings 204. If left behind, the organic residue may negatively impact the contact resistance and adhesion strength of the conductive structure formed within the opening 204. Accordingly, a desmearing process may be performed by a wet chemical treatment to remove the remaining organic residue. In an embodiment, the desmearing process also simultaneously roughens the surface of the exposed portions of the bottom pads 118. The via openings 204 allow conductive structures, such as build-up vias 112 depicted in FIG. 1C, to form on the bottom pads 118.

The next series of figures, FIGS. 2E-2H, illustrate an exemplary process for forming build-up vias 112 and build-up traces 110, as shown in FIG. 1C, to complete the SAP which begun in FIG. 2B. After forming the via openings 204, a seed layer 108 is blanket deposited as shown in FIG. 2E. Any suitable deposition technique, such as sputtering, may deposit the seed layer 108. The seed layer 108 provides a surface upon which a conductive layer may be deposited. In an embodiment, the seed layer 108 is a surface for electrolytic plating of a conductive material as will be described further herein. Accordingly, in embodiments, the thickness of the seed layer 108 is sufficient to support electrolytic plating of a conductive material. For instance, the seed layer 108 may be 0.3 to 0.7 μm thick. In a particular embodiment, seed layer 108 is approximately 0.5 μm thick. Seed layer 108 is disposed on the adhesion layer 106 and within the via openings 204. Portions of the seed layer 108 within the via openings 204 may be disposed directly on the bottom pads 118. Accordingly, conductive structures subsequently formed within the via openings 204 may be electrically coupled to the bottom pads 118. In embodiments, the seed layer 108 is formed of a conductive material, such as a metal. In a particular embodiment, the seed layer 108 is formed of a metal containing titanium and copper.

Thereafter, in FIG. 2F, a patterned DFR layer 122 is patterned on the seed layer 108. The patterned DFR layer 122 may be formed by first laminating a layer of DFR on the seed layer 108 and then patterning the DFR layer to form trace openings 206. In an embodiment, the trace openings 206 are formed by any conventional exposure and developer process where exposure to electromagnetic radiation crosslinks the DFR film and a developer removes unexposed regions of the DFR film. In embodiments, trace openings 206 are wider than via openings 204 to allow conductive structures, such as traces (110 in FIG. 1C), to be formed above the insulating layer 114. In embodiments, patterned DFR layer 122 delineates the lateral boundaries of the build-up traces 110 by preventing conductive material from depositing on regions of the seed layer 108 covered by the patterned DFR layer 122. Accordingly, when conductive material is deposited on the seed layer 108, the conductive material may form only within the trace openings 206, as illustrated in FIG. 2G.

In FIG. 2G, build-up vias 112 and traces 110 are formed on exposed portions of the seed layer 108. Build-up vias 112 and traces 110 may be formed by any suitable deposition technique such as, but not limited to, electrolytic plating. In such cases, the seed layer 108 acts as a cathode upon which conductive materials may deposit to form the build-up vias 112 and traces 110. In embodiments, build-up vias 112 are electrically coupled to the underlying conductive layer, which may be a series of bottom pads 118 as illustrated in FIG. 2G. In an embodiment, the build-up vias 112 and traces 110 are formed of a conductive material, such as a metal. For example, the build-up vias 112 and traces 110 may be formed of copper.

Next, in FIG. 2H, the patterned DFR layer 122 is removed and portions of the seed layer 108 disposed between the build-up traces 110 are etched away, thereby completing one iteration of the SAP. Any suitable removal and etch technique well known in the art may be used to remove the patterned DFR layer 122 and the seed layer 108. Etching the portions of the seed layer 108 electrically isolates the build-up traces 110 from one another, which allows the build-up traces 110 to form separate conductive paths through the build-up structure 120. Once the layers have been removed, another iteration of an SAP may be performed to construct another layer of the build-up structure 120 as shown in FIG. 2I.

FIG. 2I illustrates the structure in FIG. 2H following another iteration of an SAP, such as the SAP illustrated in FIGS. 2B-2H. However, instead of only forming build-up vias 112 and traces 110, a bottom plate 102 for the embedded thin film capacitor 100 may be formed as well. In embodiments, bottom plate 102 is not coupled to conductive traces disposed below the bottom plate 102. In an embodiment, the bottom plate 102, build-up vias 112, and build-up traces 110 are formed simultaneously such that no additional process steps are required to form the bottom plate 102. For instance, the bottom plate 102, build-up vias 112, and build-up traces 110 may all be formed by one electrolytic plating process. Accordingly, in such embodiments, the bottom plate 102 may be formed of the same material as the build-up vias 112 and traces 110. In an embodiment, the bottom plate 102 is formed of a conductive material, such as copper.

After the bottom plate 102 is formed, the remaining embedded thin film capacitor may be formed as illustrated in FIGS. 2J-2Q. Techniques and materials used to form the embedded capacitor are similar to the processes discussed herein with regard to the SAP illustrated in FIGS. 2B-2H. Accordingly, the techniques and materials are not as thoroughly described in the discussion of the method illustrated in FIGS. 2J-2Q. If desired, detailed descriptions of such materials and techniques may be referenced from the corresponding discussion of FIGS. 2B-2H. Any notable differences, however, will be explained in detail hereinafter.

As illustrated in FIG. 2J, an insulating layer 114 is formed on top of the adhesion layer 106, build-up traces 110, and the bottom plate 102. Next, instead of forming an adhesion layer 106 immediately thereafter as disclosed with regard to performance of the SAP in FIG. 2C, an extra process step is performed as shown in FIG. 2K.

In FIG. 2K, a plate opening 208 is formed in the insulating layer 114. Any suitable patterning technique such as, but not limited to, laser ablation or an exposure and develop technique may form the plate opening 208. If laser ablation is used to form the opening 208, a desmearing process may subsequently be performed to remove any organic residue. In embodiments, plate opening 208 exposes a first portion 209 of a top surface 207 of the bottom plate 102. The plate opening 208 allows a conductive structure, such as a top plate 104 as shown in FIG. 1A, to form within the insulating layer 114. The bottom of opening 208 may be designed to have a certain surface area (e.g., length L and width W) within which a top plate may be formed to achieve a target capacitance according to design requirements as discussed herein with respect to FIG. 1B. Accordingly, the plate opening 208 has dimensions complementary to the dimensions of the top plate 104. In an embodiment, the dimensions of the plate opening 208 has a bottom opening area of less than 10 mm$^2$. Although FIG. 2K illustrates only one plate opening 208, embodiments are not so limited. For instance, more than one plate opening 208 may be formed in the insulating layer 114. In an embodiment, multiple plate openings 208 are formed in one insulating layer 114, each plate opening 208 having different dimensions according to different target capacitances. In such instances, laser ablation may form each opening 208 according to their respective dimensions.

After the plate opening 208 is formed, an adhesion layer 106 is deposited on the insulating layer 114 and the exposed portion of the bottom plate 102 as shown in FIG. 2L. The opening 208 allows the adhesion layer 106 to be deposited on the exposed portion of the bottom plate 102 without any modifications to the deposition of the adhesion layer 106. In embodiments, the adhesion layer 106 attaches structures to the insulating layer 114 and electrically insulates the first portion 209 of the bottom plate 102. In an embodiment, the adhesion layer 106 is a dielectric layer for an embedded capacitor, such as the embedded thin film capacitor 100 illustrated in FIG. 1A. Specifically, the portion of the adhesion layer 106 disposed directly on top of the bottom plate 102 performs as the dielectric layer for the embedded capacitor 100. In an embodiment, the dielectric constant of the adhesion layer 106 ranges from 4 to 9.

Next, in FIG. 2M, via openings 204 are formed through the insulating layer 114 and the adhesion layer 106. Via openings 204 allow conductive structures, such as build-up vias 112 and capacitor vias 113, to be formed within the insulating layer 114. In an embodiment, via openings 204 expose portions of conductive structures disposed below the insulating layer 114, such as portions of the build-up traces 110. In a particular embodiment, the via openings 204 also expose a second portion 205 of the bottom plate 102. The first and second portions 209 and 205 may be different regions of the bottom plate 102. In embodiments, the adhesion layer 106 disposed on the bottom plate 102 remains intact after forming the via openings 204. The via openings 204 allow capacitor vias 113 to electrically couple to the bottom plate 102, which enables operation of the embedded thin film capacitor 100.

Thereafter, in FIG. 2N, a seed layer 108 is deposited on top of the adhesion layer 106 as well as within the openings 204 and 208. Seed layer 108 is deposited on exposed portions of the underlying conductive structures, such as the traces 110/111 and the base plate 102. In an embodiment, seed layer 108 is not deposited on the region of the base plate 102 below the plate opening 208. Rather, the seed layer 108 is deposited on top of the adhesion layer 106 disposed on the bottom plate 102. The adhesion layer 106 disposed on top of the bottom plate 102 isolates the seed layer 108 from the bottom plate 102.

Next, in FIG. 2O, a patterned DFR layer 122 is formed on the seed layer 108. Patterned DFR layer 122 has trace openings 206 within which traces 110/111 may form. Additionally, in an embodiment, patterned DFR layer 122 has a wide plate opening 210 to allow formation of the top plate 104 as shown in FIG. 2P. In FIG. 2P, conductive structures, such as vias 112/113, traces 110/111, and the top plate 104, are formed within the openings 206 and 210. In an embodiment, the conductive structures are all formed simultaneously by a single process step such as an electrolytic plating step. Thereafter, as shown in FIG. 2Q, the patterned DFR layer 122 and portions of the seed layer 108 between the traces 110/111 and the top plate 104 are removed, thereby completing formation of the embedded capacitor 100.

FIGS. 2R-2S illustrate final process steps for completing the coreless package substrate 101 with an embedded thin film capacitor 100 according to embodiments of the invention. In embodiments, at least one SAP may be subsequently performed to complete formation of the build-up structure 120 as illustrated in FIG. 2R. In FIG. 2R, a last SAP process is performed to complete formation of the build-up structure 120. According to embodiments, the embedded capacitor 100 is disposed within the build-up structure 120 amongst build-up vias 112 and build-up traces 110. In an embodiment, the last SAP forms top pads 119 on top of the build-up structure 120 instead of build-up traces 110. The top pads 119 may be exposed to make electrical connection with external devices, such as integrated circuit dies, by any suitable interconnection method (e.g., flip-chip bonding). Thereafter, in FIG. 2S, the substrate 202 is removed to complete formation of the coreless package substrate 101 with an embedded thin film capacitor 100 therein. Removing the substrate 202 exposes the bottom pads 118 so that the bottom pads 118 can make electrical connection with external devices, such as a circuit board.

The method of forming the embedded thin film capacitor 100 (i.e., FIGS. 2J-3H) shares many of the same process steps as the method of performing an SAP (i.e., FIGS. 2B-2H). In fact, forming the embedded thin film capacitor 100 only requires two additional steps—forming the plate opening 208 illustrated in FIG. 2K and desmearing the remaining organic residue. The additional steps are intervening steps performed after forming the insulating layer 114 and before forming the adhesion layer 106. It is to be appreciated, however, that the additional steps are minimally intrusive as the additional steps do not affect any subsequent process steps, nor does it require performance of any other additional process steps. Therefore, the process of forming the embedded thin film capacitor 100 may be seamlessly integrated with the process of fabricating the build-up structure 120. Because both the embedded capacitor 100 and a layer of the build-up structure 120 are formed simultaneously, the embedded capacitor 100 may be formed of the same materials as the build-up structure 120. For instance, the embedded capacitor 100 has capacitor traces 111, capacitor vias 113, and plates 102 and 104 formed of the same material as the build-up vias 112 and build-up traces 110, and a dielectric layer formed of the same material as the adhesion layer 106. Accordingly, in an embodiment, the plates 102 and 104, vias 112/113, and traces 110/111 are formed of copper, and the dielectric layer and adhesion layer 106 are formed of silicon nitride.

The method of forming the embedded thin film capacitor 100 uses an adhesive layer 106 to bond layers of a build-up structure together. Accordingly, a surface roughening step is not required to form the insulating layers 114 of the build-up structure 120. According to embodiments of the invention, the method also uses the adhesive layer 106 as a dielectric layer for the embedded capacitor 100. Thus, a separate processing step is not required to form the dielectric layer, and a proprietary dielectric layer is not required to be purchased.

Figure 3:
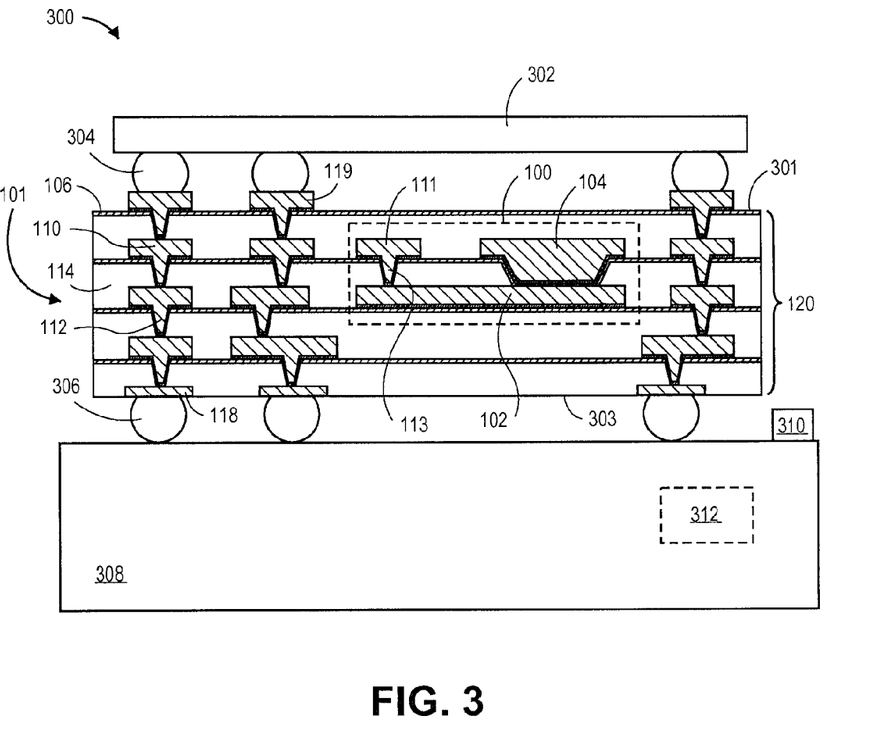
FIG. 3 illustrates a package system including a package substrate with an embedded capacitor, in accordance with an embodiment of the invention.

With reference now to FIG. 3, a package assembly 300 is illustrated according to embodiments of the invention. In an embodiment, a die 302 is coupled to the package substrate 101 through pads (not shown) on the surface of the die 302. The die 302 may be coupled to the package substrate 101 by any suitable interconnection method, such as flip-chip bonding. Solder balls 304 interconnect the die 302 to output terminals (i.e., top pads 119) on the die-level interconnect side 301 of the package substrate 101. Top pads 119 may be electrically coupled to the capacitor trace 111 and top plate 104 through the various electrical pathways in the build-up layer 120. As such, the top pads 119 may be electrically coupled to the embedded capacitor 100. Accordingly, the die 302 may be electrically coupled to the embedded capacitor 100. Embedding the capacitor 100 within the build-up structure 120 minimizes the distance from the die 302. As such, line resistances may be minimized and die operation efficiency may be improved.

As further illustrated in FIG. 3, the package substrate 101 may also be electrically coupled to a printed circuit board (PCB) 308, such as a motherboard or a daughter card. In an embodiment, the PCB 308 is coupled to the package substrate 101 through pads (not shown) on the surface of the PCB 308. Solder balls 306 may interconnect the PCB 308 to the bottom pads 118 on the second-level interconnect (SLI) side of the package substrate 101. Thus, the embedded capacitor 100 may be electrically coupled to the PCB 308 through the bottom pads 118 and the various electrical pathways in the build-up layers 120. In an embodiment, PCB 308 may include devices externally mounted on the surface of the PCB 308, such as a surface mounted device 310, or embedded within the PCB 308, such as an embedded device 312. Accordingly, the embedded capacitor 100 may also be electrically coupled to the devices 310 and 312.

Figure 4:
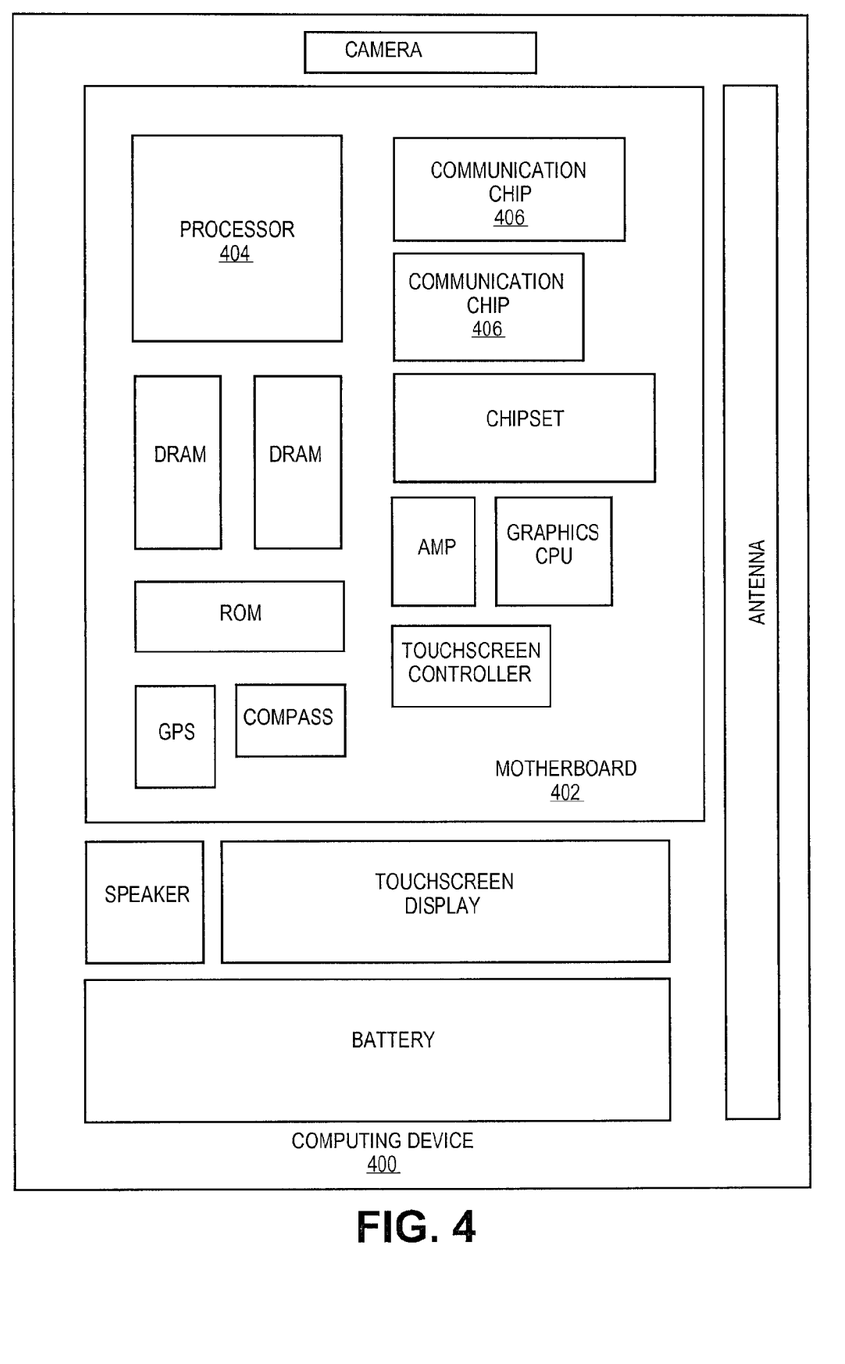
FIG. 4 illustrates a computing system implemented with one implementation of the invention.

FIG. 4 illustrates a computing system 400 implemented with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3I, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 is part of a package assembly that includes an integrated circuit die. In some implementations of the invention, the integrated circuit die is mounted on a package substrate, such as a package substrate with an embedded thin film capacitor, that is formed in accordance with implementations of the invention. The term "processor" may refer to any device or portion of a device that processes electronic data from registers and/or memory to transform that electronic data into other electronic data that may be stored in registers and/or memory.

The communication chip 406 is part of a package assembly that includes an integrated circuit die. In accordance with another implementation of the invention, the integrated circuit die is mounted on a package substrate, such as a package substrate with an embedded thin film capacitor, that is formed in accordance with implementations of the invention.

In further implementations, another component housed within the computing device 400 may contain an integrated circuit die that is mounted on a package substrate, such as a package substrate with an embedded thin film capacitor, that is formed in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

In an embodiment, an integrated circuit package includes a first adhesion layer disposed on a first insulating layer, a bottom plate and a first trace disposed on the first adhesion layer, and a second insulating layer disposed on the first trace and the bottom plate, the second insulating layer having a first opening exposing a first region of the bottom plate, a second opening exposing a second region of the bottom plate, and a third opening exposing the first trace. The integrated circuit package further includes a second adhesion layer disposed on the second insulating layer and in the first opening, a portion of the second adhesion layer is disposed on the bottom plate in the first opening, a top plate disposed on the second adhesion layer above the first region of the bottom plate, first and second vias extending through the second adhesion layer and a portion of the second insulating layer, the first via is disposed within the second opening, the second via is disposed in the third opening, and second and third traces disposed on the second adhesion layer, the second trace is coupled to the first via, the third trace is coupled to the second via.

In an embodiment the integrated circuit package further includes a seed layer disposed immediately below the top and bottom plates. In embodiments, the traces, vias, and plates are formed of the same materials. In an embodiment, the integrated circuit package further includes a third insulating layer disposed on top of the second insulating layer and the second and third traces. The first and second insulating layers may be formed of a material comprising carbon hydrogen, and oxygen. In an embodiment, the adhesive layer is between 40 to 60 nm thick. In embodiments, the integrated circuit package further includes a stiffening core disposed above or below the insulating layers. The stiffening core may be formed of a material different from the traces, vias, plates, insulating layers, and conductive layers. In an embodiment, the integrated circuit package further includes an embedded silicon bridge disposed within the traces, vias, plates, insulating layers, and conductive layers. In embodiments, the adhesion layer is formed of a material containing silicon and nitrogen. Additionally, in an embodiment, the adhesion layer is formed of a material containing silicon, nitrogen, and oxygen. The top and bottom plates may be formed of a metal. Additionally, the metal may include copper. In an embodiment, the insulating layers are formed of an insulating material. For example, the insulating layer is formed of an organic build-up film.

In an embodiment, a method of forming an integrated circuit package includes forming a first insulating layer on a bottom plate and a first trace, forming a first opening in the first insulating layer to expose a first region of the bottom plate, forming an adhesive layer on the first insulating layer and on the first region of the bottom plate, forming at least two openings through the first insulating layer and the adhesive layer, wherein one of the at least two openings exposes a second region of the bottom plate and another one of the at least two openings exposes the first trace, and forming a top plate within the first opening and a via within each opening of the at least two openings.

The first opening may be formed before forming the adhesive layer. In an embodiment, the at least two openings are formed simultaneously. In embodiments, the at least two openings are formed with the same etch process. The etch process may be laser ablation. In an embodiment, forming the at least two openings does not remove the adhesive layer on top of the first region of the bottom plate. In embodiments, the top plate and the vias are formed simultaneously. The top plate and the vias may be formed with the same deposition process. The deposition process may be an electrolytic plating process. In an embodiment, the top plate is formed on top of the adhesive layer. The via may be formed through the adhesive layer and the insulating layer. In an embodiment, forming the first opening is performed by laser ablation. In embodiments, forming the adhesive layer is performed by plasma enhanced chemical vapor deposition (PECVD). In an embodiment, the method further includes forming a seed layer on top of the exposed second region of the substrate and on top of the insulating layer prior to forming the top plate. The top plate and via may be formed by electrolytic plating of a conductive material on the seed layer. In an embodiment, the method further includes a desmearing process.

In utilizing the various aspects of this invention, it would become apparent to one skilled in the art that combinations or variations of the above embodiments are possible for forming a package substrate with an embedded thin film capacitor. Although embodiments of the present invention have been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating embodiments of the present invention.

What is claimed:

1. A capacitor comprising:
   a bottom plate;
   a first insulating layer over the bottom plate, the first insulating layer having a top surface;
   a first opening in the first insulating layer, the first opening exposing a first portion of the bottom plate;
   a second opening in the first insulating layer, the second opening exposing a second portion of the bottom plate;
   a dielectric layer on the top surface of the first insulating layer and on the first portion of the bottom plate in the first opening;
   a top plate on the dielectric layer on the top surface of the first insulating layer and on the dielectric layer on the exposed first portion of the bottom electrode in the first opening;
   a via in contact with the second portion of the bottom electrode in the second opening; and
   a trace on the via in the second opening and on the dielectric layer on the top surface of the first insulating layer.

2. The capacitor of claim 1 wherein the trace, the via, and the top and bottom plates are formed of the same materials.

3. The capacitor of claim 1 further comprising a second insulating layer disposed on the dielectric layer, on the top plate, and on the trace.

4. The capacitor of claim 3 wherein the first and second insulating layers are formed on an organic build-up film.

5. The capacitor of claim 1 wherein the dielectric layer is between 40-60 nanometers thick.

6. The capacitor of claim 1 further comprising a stiffening core disposed above or below the first and second insulating layers.

7. The integrated circuit of claim 1 wherein the dielectric layer is formed of a material comprising silicon and nitrogen.

8. The capacitor of claim 1 wherein the dielectric layer is formed of a material comprising silicon, nitrogen and oxygen.

9. The capacitor of claim 1 wherein the top and bottom plates are formed of a metal.

10. The capacitor of claim 9 wherein the metal comprises copper.

11. The method of claim 10 wherein the dielectric layer is formed by plasma enhanced chemical vapor deposition (PECVD).

12. The method of claim 10 wherein the top plate and via are formed by electrolytic plating of a conductive material on a seed layer.

13. A method of forming a capacitor comprising:
   forming a first insulating layer on a bottom plate, the first insulating layer having a top surface;
   forming a first opening in the first insulating layer, the first opening exposing a first portion of the bottom plate;
   forming a dielectric layer on the top surface of the first insulating layer and on the first portion of the bottom plate in the first opening;
   forming a second opening in the first dielectric layer and in the first insulating layer, the second opening exposing a second portion of the bottom plate; and
   forming a top plate on the dielectric layer in the first opening and forming a via on the second portion of the bottom plate in the second opening.

14. The method of claim 13 wherein the top plate and via are formed simultaneously.

15. The method of claim 14 wherein top plate and via are formed with the same deposition process.

* * * * *